(12) United States Patent
Azarian

(10) Patent No.: US 7,969,254 B2
(45) Date of Patent: Jun. 28, 2011

(54) I/Q IMPAIRMENT CALIBRATION USING A SPECTRUM ANALYZER

(75) Inventor: Michel M. Azarian, Austin, TX (US)

(73) Assignee: National Instruments Corporation, Austin, TX (US)

( * ) Notice: Subject to any disclaimer, the term of this patent is extended or adjusted under 35 U.S.C. 154(b) by 73 days.

(21) Appl. No.: 12/537,870

(22) Filed: Aug. 7, 2009

(65) Prior Publication Data

US 2011/0032046 A1 Feb. 10, 2011

(51) Int. Cl.
*H03C 1/00* (2006.01)
*H03C 3/00* (2006.01)
*H04B 1/26* (2006.01)

(52) U.S. Cl. ......................... 332/144; 455/323

(58) Field of Classification Search .................. 332/100, 332/103, 117, 144, 149; 327/238, 254, 255; 331/37, 38; 455/323
See application file for complete search history.

(56) References Cited

U.S. PATENT DOCUMENTS

| | | | |
|---|---|---|---|
| 5,119,399 A * | 6/1992 | Santos et al. | ................. 375/224 |
| 6,340,883 B1 | 1/2002 | Nara et al. | |
| 6,421,397 B1 | 7/2002 | McVey | |
| 6,421,398 B1 | 7/2002 | McVey | |
| 6,574,286 B2 | 6/2003 | McVey | |
| 6,842,489 B2 * | 1/2005 | Masenten | ................. 375/261 |
| 7,203,614 B2 | 4/2007 | Chang | |
| 7,856,048 B1 | 12/2010 | Smaini et al. | |
| 2005/0152481 A1 | 7/2005 | Lin et al. | |
| 2006/0176975 A1 | 8/2006 | Hsieh et al. | |
| 2007/0025474 A1 | 2/2007 | Moorti et al. | |
| 2008/0317171 A1 | 12/2008 | Jungerman | |
| 2009/0180527 A1 * | 7/2009 | Asami | ........................ 375/226 |
| 2010/0099363 A1 | 4/2010 | Faust et al. | |
| 2010/0329392 A1 | 12/2010 | Jensen et al. | |

* cited by examiner

*Primary Examiner* — David Mis
(74) *Attorney, Agent, or Firm* — Meyertons Hood Kivlin Kowert & Goetzel, P.C.; Jeffrey C. Hood

(57) ABSTRACT

A quadrature modulator (QM) may be calibrated by determining total equivalent offsets in the I- and Q-channels, a total equivalent gain imbalance between the I- and Q-channels, and a total equivalent phase skew between the I- and Q-channels. These values may be obtained by taking various scalar measurements of the image to signal ratio (ISR) and carrier to signal ratio (CSR) of the QM, while alternatively altering the system gain imbalance, system phase skew, I-channel offset and Q-channel offset using a respective gain parameter, phase parameter, I-channel offset parameter, and Q-channel offset parameter. The gain and phase parameters may be defined in terms of the ISR, and the channel offset parameters may be defined in terms of the CSR. The system gain imbalance, system phase skew, and total offset in the channels may then be calculated based on the various ISR and CSR measurements.

35 Claims, 4 Drawing Sheets

I/Q IMPAIRMENT CALIBRATION USING A SPECTRUM ANALYZER

BACKGROUND OF THE INVENTION

1. Field of the Invention

This invention relates generally to measurement and data acquisition systems and, more particularly, to improving calibration of instruments and systems that use quadrature modulation.

2. Description of the Related Art

Measurement systems are oftentimes used to perform a variety of functions, including measurement of physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

A typical contemporary measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a USB (Universal Serial Bus), a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT or for influencing the system being controlled. These measurement systems, which can be generally referred to as data acquisition systems (DAQs), are primarily used for converting a physical phenomenon (such as temperature or pressure) into an electrical signal and measuring the signal in order to extract information. PC-based measurement and DAQs and plug-in boards are used in a wide range of applications in the laboratory, in the field, and on the manufacturing plant floor, among others.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and receive digital signals to implement one or more digital I/O applications. DAQ devices may also include a Source-Measure Unit (SMU), which may apply a voltage to a DUT and measure the resulting current, or may apply a current to the DUT and measure the resulting voltage. In addition, many DAQ devices also include signal generators and/or vector signal generators for transmitting and receiving various types of signals that may be used during data acquisition and control. Some of these signals may oftentimes be transmitted/received wirelessly.

Digital wireless communications are typically implemented through the use of modulators and demodulators, which provide a necessary RF interface for systems such as cordless phones, wireless networks, and wireless peripheral devices for computers, in addition to test and control systems that may use a wireless interface to couple certain system elements. One commonly used modulation method is "quadrature modulation", which employs two carriers out of phase by 90° and modulated by separate signals. There are also many digital encoding standards that allow for the transmission of vast amounts of data over wireless RF interfaces in shorter periods of time.

One example of quadrature modulation is quadrature amplitude modulation, where two digital bit streams may be conveyed via a digital modulation scheme by modulating the amplitudes of two carrier waves, using amplitude-shift keying (ASK). The carrier waves, which are usually sinusoid signals, are 90° out of phase with respect to each other, and are thus called quadrature carriers. The modulated waves are summed, and the resulting waveform is a combination of both phase-shift keying (PSK) and amplitude-shift keying. A finite number of at least two phases, and at least two amplitudes are used. PSK modulators are often designed using quadrature modulation principles, but are not considered quadrature amplitude modulation schemes, since the amplitude of the modulated carrier signal is constant. Another type of quadrature modulation may use frequency shift keying, where the digital information is transmitted through discrete frequency changes of the carrier waves, instead of changes in the amplitudes of the carrier signals.

Most circuits and/or signal generators that employ quadrature modulation may require calibration to correct for offset, gain imbalance and phase skew. Most available calibration methods either involve the use of a vector network analyzer with computational complications, or binary search type methods that can be lengthy.

Other corresponding issues related to the prior art will become apparent to one skilled in the art after comparing such prior art with the present invention as described herein.

SUMMARY OF THE INVENTION

In one set of embodiments, a system and method may be devised for calibrating an instrument, system, and/or any circuit that uses a quadrature modulator. The system may include a control block configured to control operations of the quadrature modulator, which comprises a baseband I-channel and a baseband Q-channel. The control block may receive a set of values corresponding to scalar measurements of signal-ratio characteristics of the quadrature modulator, and may determine error values corresponding to system errors of the quadrature modulator, from the set of scalar values. The control block may then correct for the system errors in the quadrature modulator by applying inverse values of the error values in the respective input paths of the input signals of the I-channel and the Q-channel. In one set of embodiments, the scalar measurements of signal-ratio characteristics may include scalar image-to-signal-ratio (ISR) measurements and/or scalar carrier-to-signal-ratio (CSR) measurements, and the system errors of the quadrature modulator may include gain imbalance, phase skew, I-channel offset, and Q-channel offset.

Therefore, the scalar measurements of the signal-ratio characteristics of the quadrature modulator may include ISR measurements and CSR measurements, and the control block may determine the error values corresponding to the gain imbalance and phase skew from the ISR measurements, and the error values corresponding to the I-channel offset and the Q-channel offset from the CSR measurements. The control block may then apply the inverse values of the error values corresponding to the gain imbalance, phase skew, and channel offsets in the I and Q input paths to correct for the system impairments of the quadrature modulator.

In one set of embodiments, the system may also include a spectrum analyzer configured to take the scalar measurements of the signal-ratio characteristics of the quadrature modulator, which may be comprised in a signal generator configured to generate an RF output based on the input signals of the I-channel and the Q-channel. The control block may comprise a computer system, which may be configured to execute software for determining the various error values, performing the necessary corrections in the digital domain before the (corrected) signals are converted to analog signals and provided to the respective I-channel and Q-channel of the quadrature modulator. In one set of embodiments, the correction (or application of the impairments) may be performed using an FPGA, which may be configured on a DAQ board, which the computer system may use to interface with the signal generator and the spectrum analyzer.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
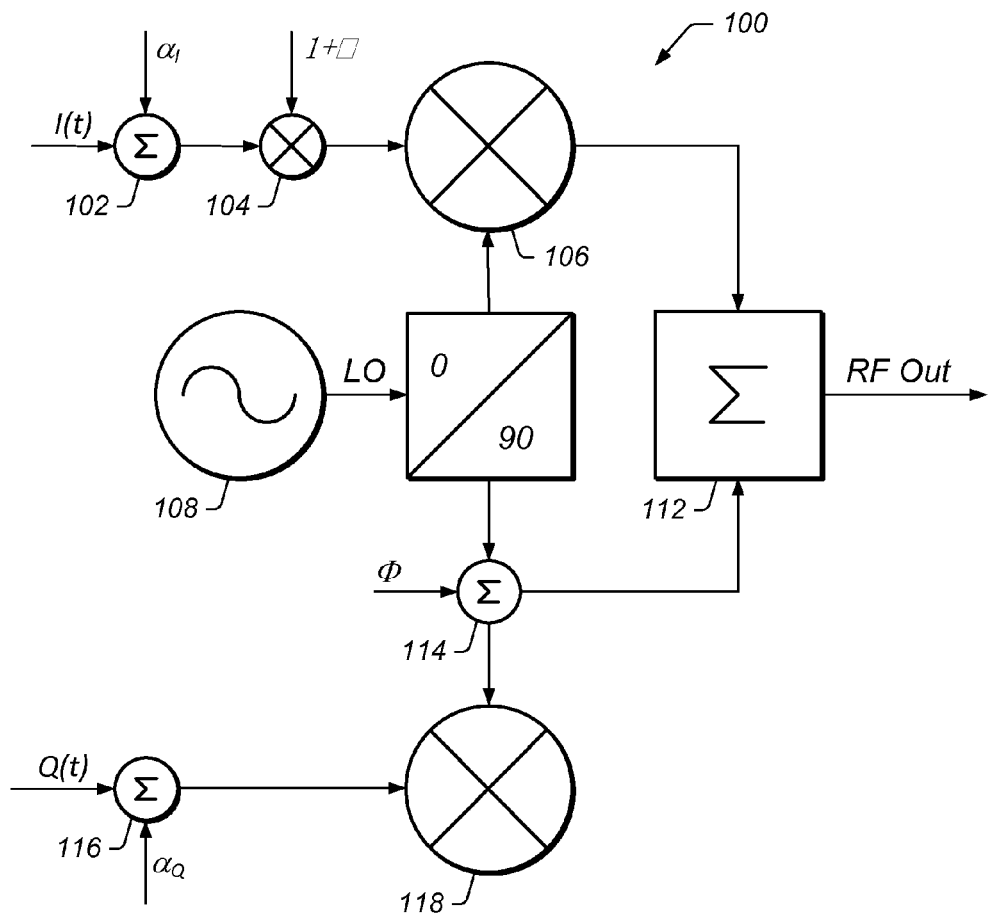
FIG. 1 shows a partial block diagram of one embodiment of a quadrature modulator with various errors that may be introduced during modulation.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Embodiments of the present invention may be used in systems configured to perform test and/or measurement functions, to control and/or model instrumentation or industrial automation hardware, or to model and simulate functions, e.g., modeling or simulating a device or product being developed or tested, etc. However, it is noted that the present invention may equally be used for a variety of applications, and is not limited to the applications enumerated below. In other words, applications discussed in the present description are exemplary only, and the present invention may be used in any of various types of systems. Thus, the system and method of the present invention is operable to be used in any of various types of applications, including the control of other types of devices such as multimedia devices, wireless systems, video devices, audio devices, telephony devices, Internet devices, etc.

In one set of embodiments, a quick and simple, yet effective method may be used to correct for gain imbalance, phase skew and offset in a direct-conversion vector signal generator that employs quadrature modulation. The correction may be achieved by using only a spectrum analyzer, while controlling the offsets of the I- and Q-channels, and the gain and phase between the I- and Q-channels. Spectrum analyzers are readily available in most electronics labs and manufacturing plants, and the various methods that will be described herein may be readily automated. A spectrum analyzer may be used to make exclusively scalar measurements while the effects of I/Q gain imbalance, phase skew and offset may be manifested through vectors. This limitation imposed by the spectrum analyzer may, however, be circumvented through a mathematical shortcut. It should be noted that although the various embodiments disclosed herein explicitly reference only a vector signal generator, the disclosed systems and methods may be equally applied to calibrate a direct-conversion vector signal analyzer, or any other similar instrument and/or circuit that features a quadrature modulator.

In one set of embodiments, a calibration method for calibrating a quadrature modulation circuit—which may be included in a direct-conversion vector signal generator or a direct-conversion vector signal analyzer—may only require taking scalar measurements, and may therefore be performed using a spectrum analyzer. FIG. 1 shows the partial block diagram of one embodiment of a quadrature modulator (QM) 100, which may include a local oscillator 108 generating a periodic signal used in mixing input signal I(t) at mixer element 106, and input signal Q(t) at mixer element 118. The RF output is generated at summing element 112.

I(t) and Q(t) may be baseband signals generated by the I and Q digital-to-analog converters (DACs—not shown), respectively. $\alpha_I$ and $\alpha_Q$ represent the total equivalent offsets in the I-channel (introduced by way of summing element 102) and the Q-channel (introduced by way of summing element 116), regardless of where the offsets are actually introduced/produced in QM 100. $\alpha_I$ and $\alpha_Q$, which may cause a carrier leakage to appear in RF Out, may be measured in Volts. $\epsilon$ represents the fraction of total equivalent gain imbalance between the I- and Q-channels, shown in FIG. 1 for illustrative purposes as being mixed into the I-channel at mixer element 104, regardless of what the actual cause of the imbalance may be. The gain imbalance may be considered as an error being introduced as a gain shift on the I-channel with respect to the Q-channel, while $\epsilon$ may be considered as an error that contributes to the appearance of an image signal in the RF Out signal. $\phi$ represents the total equivalent phase skew between the I- and Q-channels, shown for illustrative purposes in FIG. 1 as being introduced into QM 100 via mixer element 114, regardless of the actual origin for such a skew is. φ may be measured in radians. φ may be considered as contributing to the appearance of an image signal in RF Out, by causing a phase shift/skew in the Q-channel with respect to the I-channel.

Figure 2:
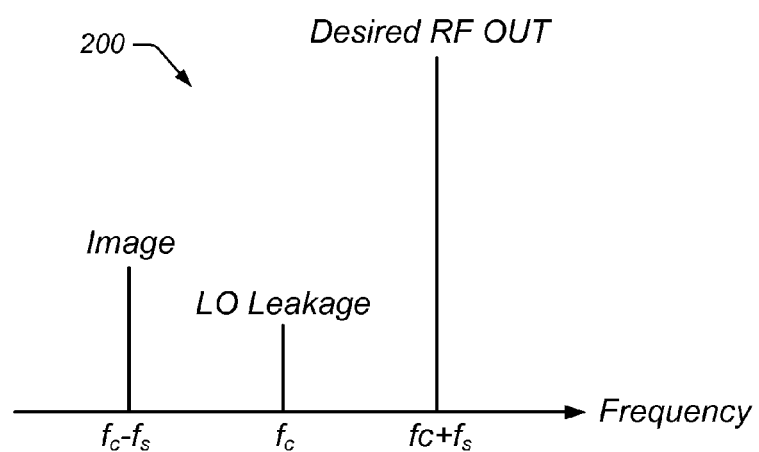
FIG. 2 shows a frequency spectrum diagram of the output of the quadrature modulator of FIG. 1.

FIG. 2 shows a frequency plot corresponding to the RF Out of QM module 100 shown in FIG. 1. A continuous waveform at a frequency offset of (+)fs as the baseband signal generated at a carrier frequency of fc may result in carrier leakage (LO Leakage) and an image (Image) as shown in FIG. 2. For a gain imbalance of ε and a phase skew of φ in radians, the image power relative to the desired RF output power, referred to as image to signal ratio (ISR), may be given by the following approximate formula:

$$ISR \approx \left(\frac{\varepsilon^2 + \varphi^2}{4}\right)$$

For a total equivalent $\alpha_I$ volts offset on the I-channel and $\alpha_Q$ volts offset on the Q-channel, and with a sinusoid being the desired output generated to produce approximately 0 dBm into 50Ω, the carrier power to desired RF output power, referred to as carrier to signal ratio (CSR), may be given by the following approximate formula:

$$CSR \approx 10(\alpha_I^2 + \alpha_Q^2)$$

In one set of embodiments, an algorithm may be configured to incorporate a few ISR and CSR measurements using a spectrum analyzer, and control the gain imbalance, phase skew and offset of the baseband generator. It should be noted that the ISR and CSR measurements made with a spectrum analyzer may be given in decibels relative to the carrier (dBc) while the formulas for ISR and CSR given above may be plain ratios, i.e. ratios not dBc. The following formulas may establish the relationships between the desired ISR and CSR ratios (non-dBc), and their counterparts that may be expressed in terms of dBc.

$$ISR = 10^{\frac{ISR_{in\,dBc}}{10}}$$

and $$CSR = 10^{\frac{CSR_{in\,dBc}}{10}}.$$

Consolidating the gain imbalance, phase skew and offset contributed at different stages in I/Q modulator 100 to single contribution points as shown in FIG. 1 (i.e. at entry points 102, 104, 114, and 116) may simplify the analysis without loss of generality as long as such a simplification does not significantly alter the final results, for example when the baseband bandwidth is relatively small compared to the carrier frequency.

ISR (Image to Signal Ratio) Correction

Figure 3:
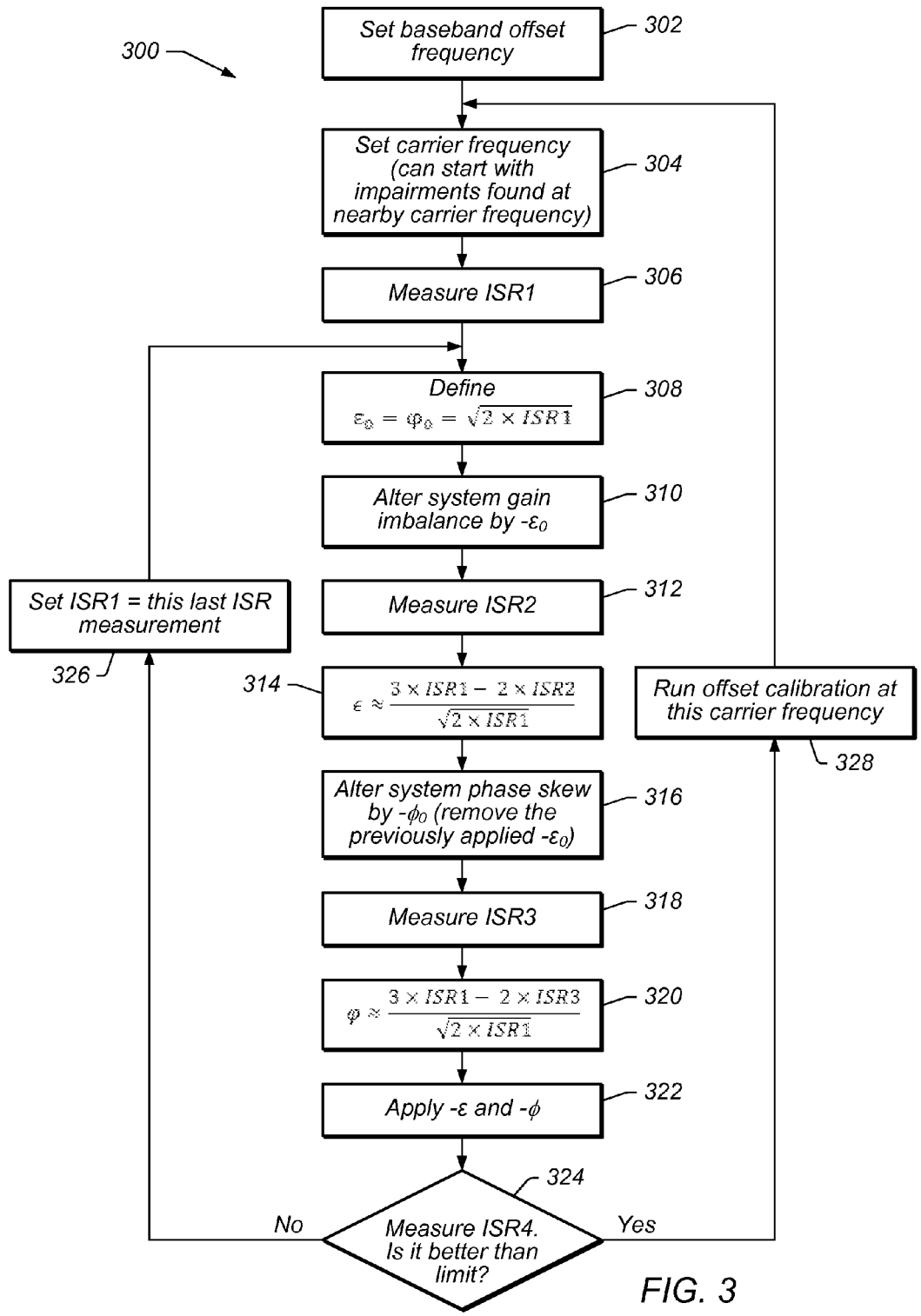
FIG. 3 shows the flow diagram of one embodiment of a method to correct the gain imbalance and phase skew in the quadrature modulator of FIG. 1.

FIG. 3 shows the flowchart 300 of one embodiment of a method to correct the gain imbalance and phase skew in the quadrature modulator of FIG. 1. Flowchart 300 details a method for determining the respective values of ε and φ, which represent the total equivalent gain imbalance between the I- and Q-channel and the total equivalent phase skew between the I- and Q-channel, respectively. Step 328, which is directed at calibrating for the offset at the carrier frequency is detailed in flowchart 400 of FIG. 4, which will be discussed in more detail below in the section directed at the offset to signal ration (OSR) correction.

As shown in FIG. 3, the method for determining the respective values of ε and φ may include setting a baseband offset frequency, where the baseband may be a single-sideband sine wave as opposed to a DC signal, (302) and generate approximately a 0 dBm (1 mW of output power) RF tone at that baseband offset frequency. The carrier frequency may then be set (304), and the (non dBc) ISR may be measured (306). This measured ISR value, referred to herein as ISR1, may be due to some error represented by ε and φ (as shown in FIG. 1), which are to be determined. ISR1 may be related to ε and φ by the following formula as previously defined:

$$ISR1 \approx \left(\frac{\varepsilon^2 + \varphi^2}{4}\right).$$

At this point, a gain parameter value $\varepsilon_0$ and a phase parameter value $\varphi_0$ may be defined in terms of the measured scalar ISR1 value (308), such that $$\varepsilon_0 = \varphi_0 = \sqrt{2 \times ISR1}.$$

Gain parameter $\varepsilon_0$ and phase parameter $\varphi_0$ may be defined as positive numbers. In this case, $\varepsilon_0$ and $\varphi_0$ may be defined such that ISR1 is caused by hypothetically equal gain imbalance and phase skew errors. A gain imbalance equal to $-\varepsilon_0$ may be introduced to alter the system gain imbalance (310), and a second ISR measurement may be taken (312), referred to herein as ISR2. According to the previously introduced formulation, $$ISR2 \approx \left(\frac{(\varepsilon - \varepsilon_0)^2 + \varphi^2}{4}\right).$$

The total equivalent gain imbalance may then be expressed in terms of ISR1 and ISR2 (314). This may be accomplished by first expanding ISR2, resulting in, $$ISR2 \approx \left(\frac{\varepsilon^2 + \varphi^2}{4}\right) + \frac{\varepsilon_0^2}{4} - \frac{\varepsilon \times \varepsilon_0}{2}.$$

Replacing $$\left(\frac{\varepsilon^2 + \varphi^2}{4}\right)$$

with ISR1, and $\varepsilon_0$ with $$\varepsilon_0 = \sqrt{2 \times ISR1}$$

yields $$2 \times ISR2 = 3 \times ISR1 - \varepsilon \times \sqrt{2 \times ISR1},$$

which may be solved for $\epsilon$ to obtain an approximate value for the (total equivalent) system gain imbalance, $$\varepsilon \approx \frac{3 \times ISR1 - 2 \times ISR2}{\sqrt{2 \times ISR1}}.$$

In a similar manner, a phase skew equal to $-\phi_0$ may be introduced (316), without applying the previously present gain imbalance. In other words, the phase skew $(-\phi_0)$ may be applied after removing the previously applied gain imbalance $(-\epsilon_0)$. The ISR may again be measured, referenced herein as ISR3, where $$ISR3 \approx \left(\frac{\varepsilon^2 + (\varphi - \varphi_0)^2}{4}\right).$$

An approximation for the (total equivalent) system phase skew may be derived (320) in a manner similar to the derivation of the (total equivalent) system gain imbalance provided above, yielding, $$\varphi \approx \frac{3 \times ISR1 - 2 \times ISR3}{\sqrt{2 \times ISR1}}.$$

Subsequently, $-\epsilon$ and $-\phi$ (i.e. the negative equivalents of the found imbalance and phase skew, respectively) may be introduced/applied at baseband from this point on, to correct for the system gain imbalance and phase skew, respectively (322). Another ISR measurement may be taken at this point, referred to as ISR4, to see if the achieved level of image rejection is acceptable (324). If the image rejection is not acceptable, ISR1 may be set to the value of ISR4, and the process may be repeated by branching back to step 308, while correcting the gain imbalance and phase skew of QM 100 using the current values of $\epsilon$ and $\phi$ as previously determined (i.e. by applying $-\epsilon$ and $-\phi$ according to the most recently determined values of $\epsilon$ and $\phi$). This may operate to fine-tune the set of impairment correction numbers. If the image rejection is acceptable, the offset calibration may be performed at the current frequency (328).

CSR (Carrier to Signal Ratio) Correction

Figure 4:
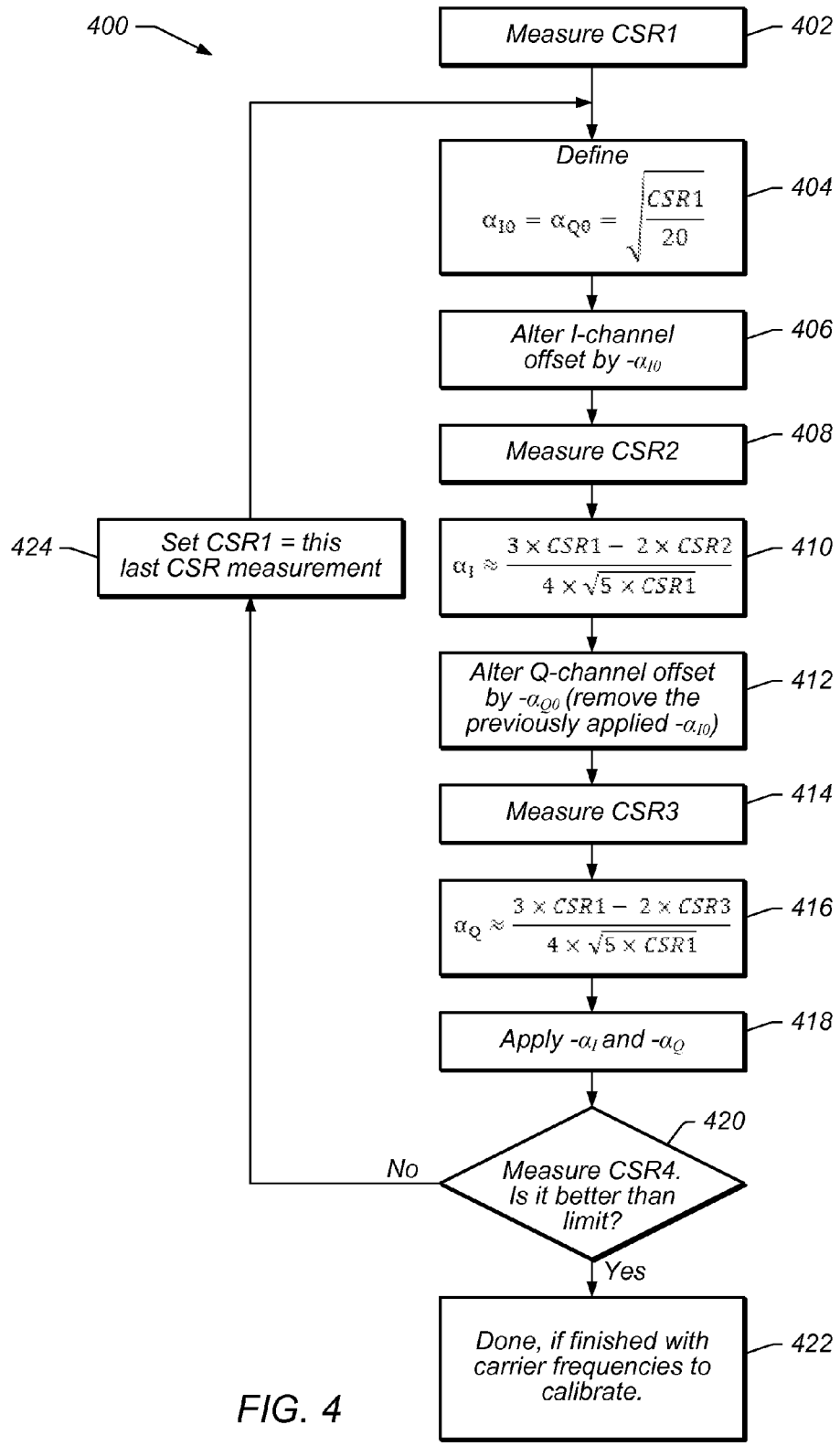
FIG. 4 shows the flow diagram of one embodiment of the offset calibration step from the flow diagram of FIG. 3.

As previously mentioned, FIG. 4 shows a flowchart 400 of one possible method for performing the offset calibration step 328 from flowchart 300 of FIG. 3. Flowchart 400 details a method for determining the respective values of $\alpha_I$ and $\alpha_Q$, which represent the total equivalent offsets in the I- and Q-channels, respectively.

A first measurement of the current value (non dBc) of CSR, referred to herein as CSR1 may be obtained (402). CSR1 may be due to some error represented by $\alpha_I$ and $\alpha_Q$ (shown in FIG. 1), which are to be determined. CSR1 may be related to $\alpha_I$ and $\alpha_Q$ by the following formula as previously defined, $$CSR1 \approx 10(\alpha_I^2 + \alpha_Q^2).$$

At this point, a first (I-channel) offset parameter $\alpha_{I0}$ and a second (Q-channel) offset parameter $\alpha_{Q0}$ may be defined (404), such that $$\alpha_{I0} = \alpha_{Q0} = \sqrt{\frac{CSR1}{20}}.$$

Offset parameters $\alpha_{I0}$ and $\alpha_{Q0}$ may be defined as positive numbers. In this case, $\alpha_{I0}$ and $\alpha_{Q0}$ may be defined such that CSR1 is the result of hypothetical equal offsets in the I-channel and in the Q-channel.

An I-channel offset equal to $-\alpha_{I0}$ may be introduced into the I-channel of QM 100 (406), and a second CSR measurement, referred to CSR2 may be taken (408). According to the previously disclosed formulation, $$CSR2 \approx 10((\alpha_I - \alpha_{I0})^2 + \alpha_Q^2).$$

Expanding CSR2 may yield $$CSR2 \approx 10(\alpha_I^2 + \alpha_Q^2) + 10 \times \alpha_{I0}^2 - 20 \times \alpha_I \times \alpha_{I0}.$$

Replacing $$10(\alpha_I^2 + \alpha_Q^2)$$

by CSR1, and replacing $\alpha_{I0}$ with $$\alpha_{I0} = \sqrt{\frac{CSR1}{20}}$$

yields $$2 \times CSR2 = 3 \times CSR1 - 2 \times \alpha_I \times \sqrt{20 \times CSR1},$$

which may be solved for $\alpha_I$ to obtain an approximate value for the first offset, i.e. the I-channel offset (410), $$\alpha_I \approx \frac{3 \times CSR1 - 2 \times CSR2}{4 \times \sqrt{5 \times CSR1}}.$$

In a similar manner, a Q-channel offset equal to $-\alpha_{Q0}$ may be introduced, without introducing an I-channel offset (412). In other words, the previously applied I-channel offset $\alpha_{I0}$ may be removed, applying only the Q-channel offset. A third CSR measurement, referenced as CS3, may then be taken (414), where $$CSR3 \approx 10(\alpha_I^2 + (\alpha_Q - \alpha_{Q0})^2).$$

The system Q-channel offset (or total equivalent offset for the Q-channel) may then be derived and approximated in a manner similar to that presented for the I-channel offset, yielding, $$\alpha_Q \approx \frac{3 \times CSR1 - 2 \times CSR3}{4 \times \sqrt{5 \times CSR1}}.$$

At this point, $-\alpha_I$ and $-\alpha_Q$ may be introduced at the baseband to correct for the system offset errors (418), and a fourth CSR measurement, referenced as CSR4 may be obtained (420) to see if the achieved level of carrier rejection is acceptable. If the achieved level of carrier rejection is not acceptable, CSR1 may be set to the value of CSR4, and the process may be repeated by branching back to step 404, while correcting the offsets of QM 100 using the current values of $\alpha_I$ and $\alpha_Q$, (i.e. by applying $-\alpha_I$ and $-\alpha_Q$ according to the most recently determined values of $\alpha_I$ and $\alpha_Q$). This may operate to fine-tune the set of offset correction numbers. If the achieved level of carrier rejection is acceptable, the process may end for the given carrier frequency. The process represented by flowcharts 300 and 400 may be repeated for all carrier frequencies for which calibration is desired. It should also be noted that the ISR correction and CSR correction may also be performed independently or in reverse order if so desired for any reason, and ISR correction may also be performed (according to flow diagram 300) without performing CSR correction, and CSR correction may be performed (according to flow diagram 400) without previously performing ISR correction.

Figure 5:
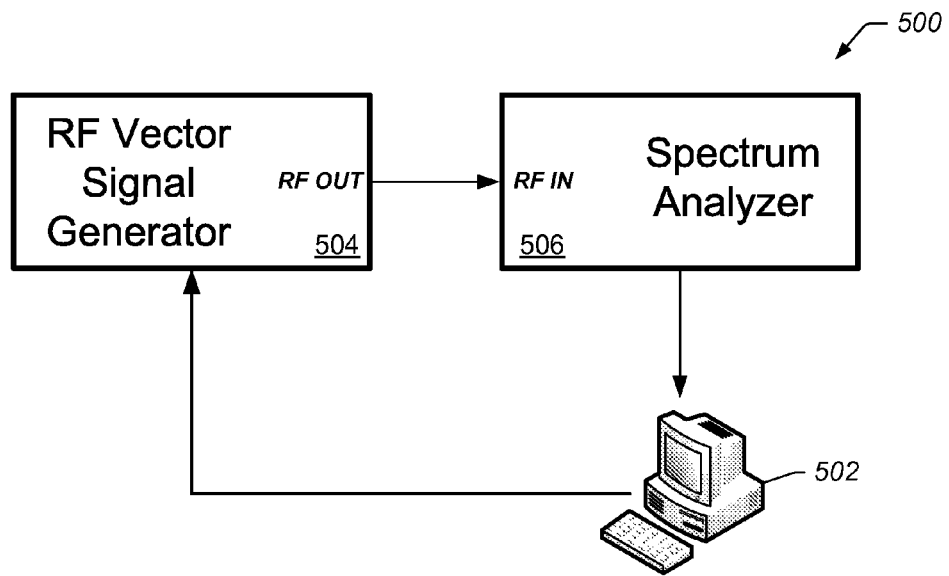
FIG. 5 shows one embodiment of a system configured to calibrate a signal generator that uses quadrature modulation.

FIG. 5 shows one embodiment of a system 500 that uses an RF signal generator 504 employing quadrature modulation. In one set of embodiments, signal generator 504 may be configured to generate an RF output according to the block diagram shown in FIG. 1. The signals to be transmitted/generated by signal generator 504 may be transmitted by computer system 502, which may be configured, among other things, as a control block to at least partially control operations of the QM circuit within signal generator 504. In one set of embodiments, computer system 502 may include one or more DAQ boards and/or arbitrary waveform generator, for example, which may be configured to interface with signal generator 504, and at least partially control certain operations of signal generator 504. Computer system 502 may also be configured to execute software that may also at least partially contribute to controlling signal generator 504. The RF output generated by signal generator 504 may be transmitted to and received by spectrum analyzer 506, which may be configured to perform the ISR and CSR measurements outlined in the flow diagrams of FIG. 3 and FIG. 4. The control block (which may be computer system 502, also including one or more DAQ boards) may receive the measurements, and obtain the system gain imbalance, system phase skew, and system channel offset values as outlined in the flow diagrams of FIG. 3 and FIG. 4.

As mentioned above, software executing on computer system 502 may contribute to at least partially controlling spectrum analyzer 506, and may perform the required calculations outlined in the flow diagrams of FIG. 3 and FIG. 4. Computer system 502 may ultimately obtain the impairments (i.e. the gain imbalance, phase skew, and channel offset value), and control the baseband of RF vector signal generator 504 along with the other settings needed to operate the generator. It should be noted, that in some embodiments (not shown), the control block may be comprised within signal generator 504, if signal generator 504 is to feature a form of self-calibration, in which case the output signal from spectrum analyzer may be provided back to signal generator 504, to provide the ISR and CSR numbers to the control block within the control block of signal generator 504. In such a case, specially configured hardware, or a local processing unit within the control block configured in signal generator 504 may perform the necessary calculations to obtain the impairments, and apply values corresponding to the impairments in such a manner as to correct for the impairments. It should also be noted, that in lieu of software executing on computer system 502, the required calculations may also be performed by hardware configured for that purpose within computer system 502, or a combination of hardware and software. Those skilled in the art will appreciate the various combinations in which the controls described herein may be applied to correct for the impairments of signal generator 504.

Figure 6:
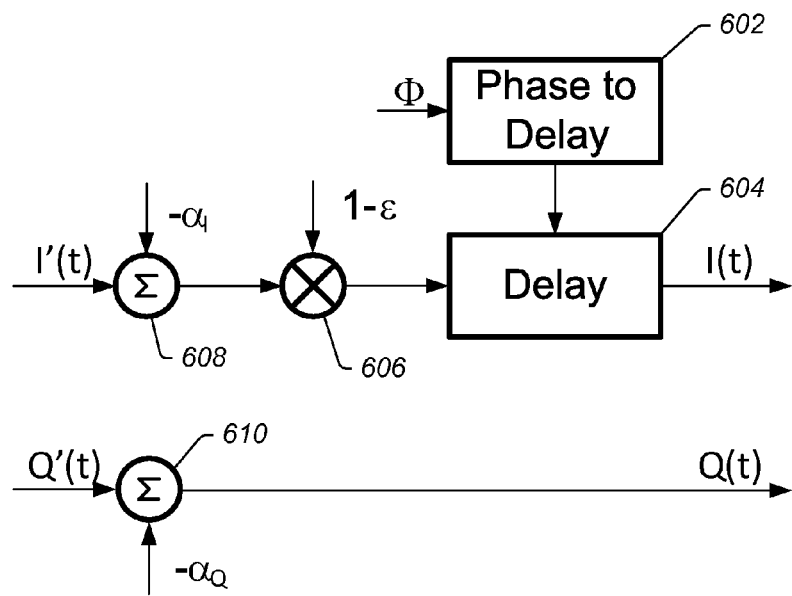
FIG. 6 shows a partial block diagram of one embodiment of calibration control to correct for measured gain imbalance, phase skew, and channel offset.

FIG. 6 shows a partial block diagram of one embodiment of calibration control to correct for measured gain imbalance, phase skew, and channel offset for a quadrature modulator such as QM 100 in FIG. 1, for example. As shown in FIG. 6, the impairments may be applied to the I- and Q-channels digitally, before the data corresponding to the I-channel and the Q-channel are converted to analog in the system, for example in computer system 502. I'(t) and Q'(t) represent the desired I-channel and Q-channel data, in digital format, to be transmitted through signal generator 504. The impairments (imbalance, skew and offset information/data) are as defined in FIG. 1. As shown, opposite, i.e. negative one (−1) multiple or inverse of the obtained I-channel and Q-channel offset values may be applied at summing nodes 608 and 610, respectively, and a −1 multiple of the obtained gain imbalance value may be applied as shown at mixing element 606. The phase to delay, i.e. the phase corresponding to a −1 multiple of the obtained phase skew value may be obtained through phase to delay block 602, and applied via delay block 604. The I(t) and Q(t) signals therefore represent the channel signals that will yield a correct RF output based on the impairments of signal generator 504. It should be noted that the block diagram of FIG. 6 is shown for illustrative purposes, and mixing element 606, summing nodes 608 and 610, and phase to delay block 602 and delay block 604 may be applied in the opposite channel path if so desired.

In one set of embodiments, an FPGA (field programmable gate array) may be used to implement the simplified block diagram shown in FIG. 6 to apply the impairments. The FPGA may also be included in computer system 502, or in signal generator 504 if signal generator 504 is configured to be self-calibrating. In other embodiments, the partial block diagram may be implemented by means other than an FPGA, and included in computer system 502. Those skilled in the art will appreciate the different means by which the correction block shown in FIG. 6 may be implemented. I(t) and Q(t) may then be converted to analog signals using a digital-to-analog converter (DAC), and provided to the modulator, for example modulator 100 shown in FIG. 1.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A method for calibrating a quadrature modulator (QM), the method comprising:
   (a) defining an image to signal ratio (ISR) characteristic of the QM as a function of:
      a total equivalent gain imbalance (EGI) between an I-channel (IC) and a Q-channel (QC) of the QM; and
      a total equivalent phase skew (EPS) between the IC and the QC;
   (b) setting a baseband offset frequency for the QM;
   (c) setting a carrier frequency for the QM;
   (d) measuring a current ISR of the QM to obtain a first ISR value;
   (e) defining a gain parameter based on the first ISR value;
   (f) altering a system gain imbalance of the QM according to the gain parameter;
   (g) measuring the current ISR of the QM subsequent to said altering to obtain a second ISR value; and
   (h) obtaining the EGI of the QM from the first ISR value and the second ISR value.

2. The method of claim 1, further comprising correcting the system gain imbalance according to the EGI.

3. The method of claim 1, further comprising:
(i) defining a phase parameter based on the first ISR value;
(j) subsequent to said obtaining the EGI, restoring the system gain imbalance to what it was prior to said altering the system gain imbalance of the QM according to the gain parameter;
(k) altering a system phase skew of the QM according to the phase parameter;
(l) measuring the current ISR of the QM subsequent to said altering the system phase skew to obtain a third ISR value; and
(m) obtaining the EPS from the first ISR value and the second ISR value.

4. The method of claim 3, further comprising performing:
correcting the system gain imbalance according to the EGI; and
correcting the system phase skew according to the EPS.

5. The method of claim 4;
wherein said correcting the system gain imbalance comprises altering the system gain imbalance by applying a negative one multiple of the EGI to the QM; and
wherein said correcting the system phase skew comprises altering the system phase skew by applying a negative one multiple of the EPS to the QM.

6. The method of claim 3, further comprising:
(n) correcting the system gain imbalance according to the EGI;
(o) correcting the system phase skew according to the EPS;
(p) measuring the current ISR of the QM to obtain a fourth ISR value subsequent to said correcting the system gain imbalance and said correcting the system phase skew;
(q) comparing the fourth ISR value to a specified ISR value to determine if the fourth ISR value is acceptable; and
in response to (q) indicating that the fourth ISR value is not acceptable, performing the following until (q) indicates that the fourth ISR value is acceptable:
setting the first ISR value to the fourth ISR value; and
performing (e) through (q).

7. The method of claim 3, further comprising:
(n) correcting the system gain imbalance according to the EGI;
(o) correcting the system phase skew according to the EPS;
(p) defining a carrier to signal ratio (CSR) characteristic of the QM as a function of a total equivalent offset in the IC (EOI) and a total equivalent offset in the QC (EOQ);
(q) measuring a current CSR of the QM to obtain a first CSR value;
(r) defining an IC offset parameter based on the first CSR value;
(s) altering an IC offset according to the IC offset parameter;
(t) measuring the current CSR of the QM subsequent to said altering the IC offset to obtain a second CSR value;
(u) obtaining the EOI of the QM from the first CSR value and the second CSR value.

8. The method of claim 7, further comprising correcting the IC offset according to the EOI.

9. The method of claim 7, further comprising:
(v) defining a QC offset parameter based on the first CSR value;
(w) subsequent to said obtaining the EOI, restoring the IC offset to what it was prior to said altering the IC offset according to the IC offset parameter;
(x) altering a QC offset according to the QC offset parameter;
(y) measuring the current CSR of the QM subsequent to said altering the QC offset to obtain a third CSR value; and
(z) obtaining the EOQ from the first CSR value and the second CSR value.

10. The method of claim 9, further comprising performing:
correcting the IC offset according to the EOI; and
correcting the QC offset according to the EOQ.

11. The method of claim 10;
wherein said correcting the IC offset comprises altering the IC offset by applying a negative one multiple of the EOI to the QM; and
wherein said correcting the QC offset comprises altering the QC offset by applying a negative one multiple of the EOQ to the QM.

12. The method of claim 9, further comprising:
(A) correcting the IC offset according to the EOI;
(B) correcting the QC offset according to the EOQ;
(C) measuring the current CSR of the QM to obtain a fourth CSR value subsequent to said correcting the IC offset and said correcting the QC offset;
(D) comparing the fourth CSR value to a specified CSR value to determine if the fourth CSR value is acceptable; and
in response to (D) indicating that the fourth CSR value is not acceptable, performing the following until (D) indicates that the fourth CSR value is acceptable:
setting the first CSR value to the fourth CSR value; and
performing (n) through (z) and (A) through (D).

13. A system comprising:
a quadrature modulation circuit (QMC) comprising an I-channel (IC) and a Q-channel (QC); and
a control block configured to control operations of the QMC, wherein the control block is configured to:
(a) define an image to signal ratio (ISR) characteristic of the QMC as a function of:
a total equivalent gain imbalance (EGI) between the IC and the QC; and
a total equivalent phase skew (EPS) between the IC and the QC;
(b) set a baseband offset frequency for the QMC;
(c) set a carrier frequency for the QMC;
(d) receive a measured current ISR of the QMC to obtain a first ISR value;
(e) define a gain parameter based on the first ISR value;
(f) alter a system gain imbalance of the QMC according to the gain parameter;
(g) receive a measured current ISR of the QMC subsequent to said altering to obtain a second ISR value; and
(h) obtain the EGI of the QMC from the first ISR value and the second ISR value.

14. The system of claim 13, wherein the control block is further configured to:
(i) define a phase parameter based on the first ISR value;
(j) subsequent to obtaining the EGI, restore the system gain imbalance to what it was prior to the control block altering the system gain imbalance of the QM according to the gain parameter;
(k) alter a system phase skew of the QMC according to the phase parameter;
(l) receive a measured current ISR of the QMC subsequent to altering the system phase skew to obtain a third ISR value; and
(m) obtain the EPS from the first ISR value and the second ISR value.

15. The system of claim 14, wherein the control block is further configured to:
(n) correct the system gain imbalance according to the EGI; and
(o) correct the system phase skew according to the EPS.

16. The system of claim 15;
wherein in correcting the system gain imbalance, the control block is further configured to apply a negative one multiple of the EGI to the QMC to alter the system gain imbalance; and
wherein in correcting the system phase skew, the control block is further configured to apply a negative one multiple of the EPS to the QMC to alter the system phase skew.

17. The system of claim 15, wherein the control block is further configured to:
(p) receive a measured current ISR of the QMC to obtain a fourth ISR value subsequent to the control block correcting the system gain imbalance and the control block correcting the system phase skew;
(q) compare the fourth ISR value to a specified ISR value to determine if the fourth ISR value is acceptable; and
(r) if the fourth ISR value is not acceptable:
set the first ISR value to the fourth ISR value; and
perform (e) through (r).

18. A system comprising:
a quadrature modulation circuit (QMC) comprising an I-channel (IC) and a Q-channel (QC); and
a control block configured to control operations of the QMC, wherein the control block is configured to:
(a) define a carrier to signal ratio (CSR) characteristic of the QMC as a function of a total equivalent offset in the IC (EOI) and a total equivalent offset in the QC (EOQ);
(b) set a baseband offset frequency for the QMC;
(c) set a carrier frequency for the QMC;
(d) receive a measured current CSR of the QMC to obtain a first CSR value;
(e) define an IC offset parameter based on the first CSR value;
(f) alter an IC offset according to the IC offset parameter;
(g) receive a measured current CSR of the QMC subsequent to said altering the IC offset to obtain a second CSR value;
(h) obtain the EOI of the QMC from the first CSR value and the second CSR value.

19. The system of claim 18, wherein the control block is further configured to:
(i) define a QC offset parameter based on the first CSR value;
(j) subsequent to obtaining the EOI, restore the IC offset to what it was prior to the control block altering the IC offset according to the IC offset parameter;
(k) alter a QC offset according to the QC offset parameter;
(l) receive a measured current CSR of the QMC subsequent to the control block altering the QC offset to obtain a third CSR value; and
(m) obtain the EOQ from the first CSR value and the second CSR value.

20. The system of claim 19, wherein the control block is further configured to:
(n) correct the IC offset according to the EOI; and
(o) correct the QC offset according to the EOQ.

21. The system of claim 20;
wherein in correcting the IC offset, the control block is further configured to apply a negative one multiple of the EOI to the QMC to alter the IC offset; and
wherein in correcting the QC offset, the control block is further configured to apply a negative one multiple of the EOQ to the QMC to alter the QC offset.

22. The system of claim 20, wherein the control block is further configured to:
(p) receive a measured current CSR of the QMC to obtain a fourth CSR value subsequent to the control block correcting the IC offset and the control block correcting the QC offset;
(q) compare the fourth CSR value to a specified CSR value to determine if the fourth CSR value is acceptable; and
(r) if the fourth CSR value is not acceptable:
set the first CSR value to the fourth CSR value; and
perform (e) through (r).

23. A system comprising:
a control block configured to control operations of a quadrature modulation circuit (QMC) comprising an I-channel and a Q-channel, wherein the control block is configured to:
receive a set of values corresponding to scalar measurements of signal-ratio characteristics of the QMC;
from the set of values, determine error values corresponding to system errors of the QMC; and
correct for the system errors in the QMC by applying inverse values of the error values in respective input paths of input signals of the I-channel and the Q-channel.

24. The system of claim 23, wherein the scalar measurements of signal-ratio characteristics comprise one or more of:
scalar image-to-signal-ratio measurements; or
scalar carrier-to-signal-ratio measurements.

25. The system of claim 23, wherein the system errors of the QMC comprise:
gain imbalance;
phase skew;
I-channel offset; and
Q-channel offset.

26. The system of claim 25, wherein the scalar measurements of the signal-ratio characteristics of the QMC comprise:
scalar image-to-signal-ratio (ISR) measurements; and
scalar carrier-to-signal-ratio (CSR) measurements;
wherein the control block is configured to:
determine the error values corresponding to the gain imbalance and phase skew from the ISR measurements; and
determine the error values corresponding to the I-channel offset and the Q-channel offset from the CSR measurements.

27. The system of claim 26, wherein the control block is configured to:
apply the inverse values of the error values corresponding to the gain imbalance, phase skew, and channel offsets in the respective input paths of the input signals of the I-channel and the Q-channel.

28. The system of claim 23, further comprising a spectrum analyzer configured to take the scalar measurements of the signal-ratio characteristics of the QMC.

29. The system of claim 23, wherein the QMC is comprised in a signal generator configured to generate an RF output based on the input signals of the I-channel and the Q-channel.

30. The system of claim 23, wherein the control block comprises a computer system.

31. A method for controlling a quadrature modulation circuit (QMC) comprising an I-channel and a Q-channel, the method comprising:

receiving a set of values corresponding to scalar measurements of signal-ratio characteristics of the QMC;
determining, from the set of values, error values corresponding to system errors of the QMC; and
correcting for the system errors in the QMC by applying inverse values of the error values in respective input paths of input signals of the I-channel and the Q-channel.

32. The method of claim 31, further comprising:
performing the scalar measurements to obtain the set of values.

33. The method of claim 32, wherein said performing the scalar measurements comprises one or more of:
performing scalar image-to-signal-ratio (ISR) measurements; or
performing scalar carrier-to-signal-ratio (CSR measurements.

34. The method of claim 33, wherein the system errors of the QMC comprise:
gain imbalance;
phase skew;
I-channel offset; and
Q-channel offset; and wherein the method further comprises:
determining the error values corresponding to the gain imbalance and phase skew from the ISR measurements; and
determining the error values corresponding to the I-channel offset and the Q-channel offset from the CSR measurements.

35. The method of claim 34, wherein said correcting for the system errors in the QMC comprises one or more of:
applying the inverse value of the error value corresponding to the gain imbalance in the respective input path of the input signal of the I-channel or the Q-channel;
applying the inverse value of the error value corresponding to the phase skew, in the respective input path of the input signal of the I-channel or the Q-channel;
applying the inverse value of the error value corresponding to the I-channel offset in the respective input path of the input signal of the I-channel; or
applying the inverse value of the error value corresponding to the Q-channel offset in the respective input path of the input signal of the Q-channel.

\* \* \* \* \*

UNITED STATES PATENT AND TRADEMARK OFFICE
CERTIFICATE OF CORRECTION

| | | |
|---|---|---|
| PATENT NO. | : 7,969,254 B2 | Page 1 of 1 |
| APPLICATION NO. | : 12/537870 | |
| DATED | : June 28, 2011 | |
| INVENTOR(S) | : Azarian et al. | |

It is certified that error appears in the above-identified patent and that said Letters Patent is hereby corrected as shown below:

On the title page item (75), add --Ashish Khandelwal Austin, TX (US)--

Signed and Sealed this
Eighth Day of March, 2016

Michelle K. Lee
*Director of the United States Patent and Trademark Office*

UNITED STATES PATENT AND TRADEMARK OFFICE
CERTIFICATE OF CORRECTION

PATENT NO. : 7,969,254 B2
APPLICATION NO. : 12/537870
DATED : June 28, 2011
INVENTOR(S) : Azarian et al.

Page 1 of 1

It is certified that error appears in the above-identified patent and that said Letters Patent is hereby corrected as shown below:

Title Page,

Item (12), "Azarian" should read -- Azarian et al. --.

Item (75), add -- Ashish Khandelwal Austin, TX (US) --.

This certificate supersedes the Certificate of Correction issued March 8, 2016.

Signed and Sealed this
Twenty-first Day of June, 2016

Michelle K. Lee
*Director of the United States Patent and Trademark Office*